US009466965B2

(12) United States Patent
Lehtola et al.

(10) Patent No.: US 9,466,965 B2
(45) Date of Patent: *Oct. 11, 2016

(54) MOTOR CONTROL CENTER UNIT WITHDRAW WITH DOOR CLOSED

(71) Applicant: ROCKWELL AUTOMATION TECHNOLOGIES, INC., Mayfield Heights, OH (US)

(72) Inventors: Gregory David Lehtola, Menomonee Falls, WI (US); Dean Meyer, Oak Creek, WI (US); Arnaldo Hiroyuki Omoto, Brookfield, WI (US); Paul Krause, Fredonia, WI (US); Fabio Kazuo Ito, Sao Paulo (BR); Steven J. Bauer, Jr., Richland Center, WI (US); Joao Jorge Martins Freitas, Sao Paulo (BR)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 91 days.

This patent is subject to a terminal disclaimer.

(21) Appl. No.: 14/150,831

(22) Filed: Jan. 9, 2014

(65) Prior Publication Data

US 2014/0126120 A1 May 8, 2014

Related U.S. Application Data

(62) Division of application No. 12/913,902, filed on Oct. 28, 2010, now Pat. No. 8,638,561.

(60) Provisional application No. 61/258,960, filed on Nov. 6, 2009, provisional application No. 61/372,574, filed on Aug. 11, 2010.

(51) Int. Cl.
*H05K 5/00* (2006.01)
*H02G 5/06* (2006.01)
*H05K 7/14* (2006.01)

(Continued)

(52) U.S. Cl.
CPC ............... *H02G 5/06* (2013.01); *H01R 13/53* (2013.01); *H05K 7/14* (2013.01); *H05K 7/1409* (2013.01); *H05K 7/1411* (2013.01); *H02B 1/36* (2013.01); *Y10T 29/49117* (2015.01)

(58) Field of Classification Search
CPC ........... H01R 13/53; H02G 5/06; H05K 7/14
USPC ....... 361/724, 730, 752, 796, 797, 807, 675; 211/26; 312/223.6, 223.1, 223.2, 312/351.1; 29/832; 439/248, 924.1, 246, 439/247
See application file for complete search history.

(56) References Cited

U.S. PATENT DOCUMENTS 3,193,633 A    7/1965   Netzel et al.
3,790,861 A *   2/1974   Sakats ........................ 361/609

(Continued)

*Primary Examiner* — Yuriy Semenenko
(74) *Attorney, Agent, or Firm* — Fay Sharpe LLP

(57) ABSTRACT

An electrical enclosure wherein an electrical component can be moved between various positions (e.g., connected, disconnected, test, etc.) without opening an enclosure door. The electrical enclosure supports a component for movement between a withdrawn position, a test position, and an inserted position. A handle is accessible by an operator from an exterior of the enclosure and is configured to move the component between the respective positions without having to open the enclosure. The handle is integral with the enclosure and thus an operator needs no special tool or other device to effect movement of the electrical component between its respective positions.

16 Claims, 11 Drawing Sheets

(51) Int. Cl.
  *H01R 13/53* (2006.01)
  *H02B 1/36* (2006.01)

(56) References Cited

U.S. PATENT DOCUMENTS

| | | | |
|---|---|---|---|
| 4,038,585 A | 7/1977 | Wolski et al. | |
| 4,317,160 A | 2/1982 | Tillson et al. | |
| 4,648,009 A | 3/1987 | Beun et al. | |
| 4,926,286 A | 5/1990 | Maki et al. | |
| 4,967,311 A | 10/1990 | Ferchau et al. | |
| 5,206,468 A | 4/1993 | Kobayashi et al. | |
| 5,343,355 A | 8/1994 | Ishikawa | |
| 5,344,332 A | 9/1994 | Lopez et al. | |
| 5,486,978 A * | 1/1996 | Fishovitz | 361/617 |
| 5,757,260 A | 5/1998 | Smith et al. | |
| 6,563,062 B2 | 5/2003 | Kurano et al. | |
| 6,592,387 B2 | 7/2003 | Komenda et al. | |
| 6,657,150 B1 | 12/2003 | Shea et al. | |
| 7,348,505 B2 * | 3/2008 | Kashyap et al. | 200/50.22 |
| 7,368,674 B2 * | 5/2008 | Parker et al. | 200/50.21 |
| 7,419,394 B2 | 9/2008 | Jensen et al. | |
| 7,688,572 B2 | 3/2010 | Yee et al. | |
| 7,726,751 B2 | 6/2010 | Bergmann et al. | |
| 7,795,532 B2 | 9/2010 | Walker | |
| 8,638,561 B2 * | 1/2014 | Lehtola et al. | 361/724 |
| 2002/0081881 A1 | 6/2002 | Komenda et al. | |
| 2005/0070166 A1 | 3/2005 | Brandt et al. | |
| 2007/0111575 A1 * | 5/2007 | Jensen et al. | 439/246 |
| 2008/0094782 A1 * | 4/2008 | Mason | 361/609 |

\* cited by examiner

MOTOR CONTROL CENTER UNIT WITHDRAW WITH DOOR CLOSED

RELATED APPLICATIONS

The present application is a divisional of U.S. patent application Ser. No. 12/913,902, filed on Oct. 28, 2010, which application claims priority to U.S. Provisional Application Ser. No. 61/258,960 filed on Nov. 6, 2009, now expired, and U.S. Provisional Application Ser. No. 61/372,574 filed on Aug. 11, 2010, now expired, the entire disclosures of each of said prior applications is hereby expressly incorporated by reference into the present specification.

BACKGROUND OF THE DISCLOSURE

The present invention relates generally to the field of packaged electrical components, and more particularly to a novel connector arrangement and system for interconnecting supported components in an enclosure with prewired connectors within the enclosure.

A wide range of packaged electrical and electronic systems have been developed that control industrial, commercial, marine and other processes. In general, such systems include both electronic monitoring and control equipment, as well as switchgear, controllers, and other power electronic equipment that drive loads. In an industrial setting, for example, motor control centers (MCCs) are large systems that house component supports or "buckets" within enclosures. The enclosures may be grouped into separate bays such that particular circuit portions may be supported on the component supports within different bays. The components typically include computer devices, such as programmable logic controllers, but also power electronic devices, such as inverter drives, motor starters, and so forth. Protective circuitry, including fuses, circuit breakers, and so forth are typically also included, along with conventional switchgear, such as relays and contactors. All of these circuit components are ultimately supported on component supports accessible through doors of the enclosures.

A particular issue that arises in some packaged electrical systems is the access to the components, and provision of network and power signals to the components even when they are not enabled for driving loads. In a typical MCC, for example, network signals, control power signals, and three phase power are all typically provided to components in the component supports. The three phase power is ultimately applied to the controlled loads. The control power is used to energize components within the system, such as relays, contactors, and so forth. The network signals serve to control such switchgear, and to exchange signals between the system and remote components and monitoring equipment.

Systems have been developed that can provide for network signals and control power when main power is disabled or disconnected from component supports in such systems. In one known system, for example, a sliding connector is used between the component supports and mating connectors within the enclosure. This sliding connector maintains contact between the conductors within the enclosure and the component support (and therethrough, the components). Conventional stabs extending from the component supports, however, can be disconnected from buses that route the main power through the enclosure. Thus, by partially extracting the component supports from their fully-engaged position, main power can be disconnected, while nevertheless providing network signals and control power for maintenance, testing, and servicing of the components supported by the component supports.

In a conventional MCC, connections between the electrical components and bus bars supplying power to and from the electrical component are typically made with the enclosure door in the open position. Similarly, connections are broken from a live power bus with the enclosure door open. This can expose an operator to an increased risk of inadvertently contact with elements within the enclosure.

BRIEF DESCRIPTION

An electrical enclosure is provided wherein an electrical component can be moved between various positions (e.g., connected, disconnected, test, etc.) without opening an enclosure door thereby eliminating or substantially reducing the risk of an operator contacting a live component within the enclosure. More particularly, an electrical enclosure is provided that supports a component for movement between a withdrawn position, a test position, and an inserted position. A handle is accessible by an operator from an exterior of the enclosure and is configured to move the component between the respective positions without having to open the enclosure. The handle is integral with the enclosure and thus an operator needs no special tool or other device to effect movement of the electrical component between its respective positions. The handle can be positively locked out if desired to prevent unauthorized or accidental movement. Providing an enclosure that can remain sealed during connection and disconnection contributes to a more arc resistant design than conventional units that have doors that must be opened.

According to one aspect, an electrical enclosure for enclosing one or more associated electrical components comprises a shell having an interior volume for housing at least one electrical component, a door for enclosing an opening to the interior volume, a support structure mounted in the shell for supporting an associated electrical component, the support structure having a moveable member movable between a first position corresponding to a connected state of the associated electrical component, and a second position corresponding to a disconnected state of the associated electrical component, and an actuating mechanism for selectively moving the moveable member of the support structure, the actuating mechanism having a handle protruding from the interior volume to an exterior of the shell for actuation with the door in a closed position. Movement of the handle between first and second positions results in corresponding movement of the moveable member of the support structure between its first and second positions to connect or disconnect the associated electrical component.

The actuating mechanism can further comprise a cam pivotally mounted to the support structure, and a linkage connecting the cam to the handle, whereby linear actuation of the handle rotates the cam to thereby displace the moveable member of the support structure between its first and second positions. At least one notch in a peripheral surface of the cam can be adapted to receive a moveable pin to selectively restrict movement of the cam. The actuating mechanism can include at least one detent for restricting movement of the support structure from its first or second position. The handle can include a hole for receiving a lock member for restricting movement of the handle. The interior volume of the shell is adapted to be enclosed during movement of the moveable member of the support structure. The interior volume can have an arc rating between. The electrical enclosure can further comprise line stabs supported by the moveable member of the support structure for movement therewith in response to movement of the handle, the line stabs adapted to selectively engage corresponding bus bars. Load stabs can also be supported by the moveable member of the support structure for movement therewith in response to movement of the handle, the load stabs adapted to selectively engage load bus bars. A component connector assembly for connecting an electrical component to a control network can be included. The moveable member of the support structure can be movable to a third position between the first and second positions corresponding to engagement of the component connector assembly and connection of the associated electrical component to a control network.

According to another aspect, an electrical enclosure for enclosing one or more associated electrical components comprises a shell having an enclosed interior volume for housing at least one electrical component, at least one movable support member mountable in the shell for supporting at least one associated electrical component, at least one actuator mechanism extending from the shell for effecting movement of the movable support member from the exterior of the enclosed shell.

The movable support member can be movable between a disengaged position and an engaged position, the disengaged position corresponding to disconnection of the associated electrical component. A component connector assembly for connecting the associated electrical component with a control network can be included. The movable support member can be moveable to connect and disconnect the component connector assembly. The moveable support member can be moveable between a first position corresponding to a disconnected state of the associated electrical component, a second position corresponding to engagement of the component connector assembly, and a third position corresponding to engagement of the component connector assembly and the electrical component. The enclosure can include a selectively releasable interlock mechanism for restricting movement of the moveable support member, the interlock mechanism being moveable between an interlocked position restricting movement of the moveable support member, and a released position permitting movement of the moveable support member. At least one line or load stab can be supported on the moveable support member for movement therewith, the at least one line or load stab configured to selectively engage a bus bar when the moveable support member is moved to an engaged position.

According to another aspect, a method of connecting/disconnecting an electrical component supported in an electrical enclosure from one or more lines comprises supporting the electrical component on a movable support member mounted within the electrical enclosure, the movable support member having at least one load or line stab associated therewith for connecting the electrical component to a bus bar, and activating an actuating mechanism configured to move the moveable support member between first and second positions, the actuating mechanism extending from a shell of the enclosure for effecting movement of the movable support member from the exterior of the enclosed shell.

The moveable support member first position can correspond to a disengaged position whereat the associated electrical component is disconnected, and the second position can correspond to an engaged position whereat the associated electrical component is connected. The method can further include releasing an interlock mechanism prior to activating the actuating mechanism. The activating step includes manually moving a handle of the actuating mechanism, the handle extending from an interior of the electrical enclosure to an exterior of the electrical enclosure.

DETAILED DESCRIPTION

Figure 1:
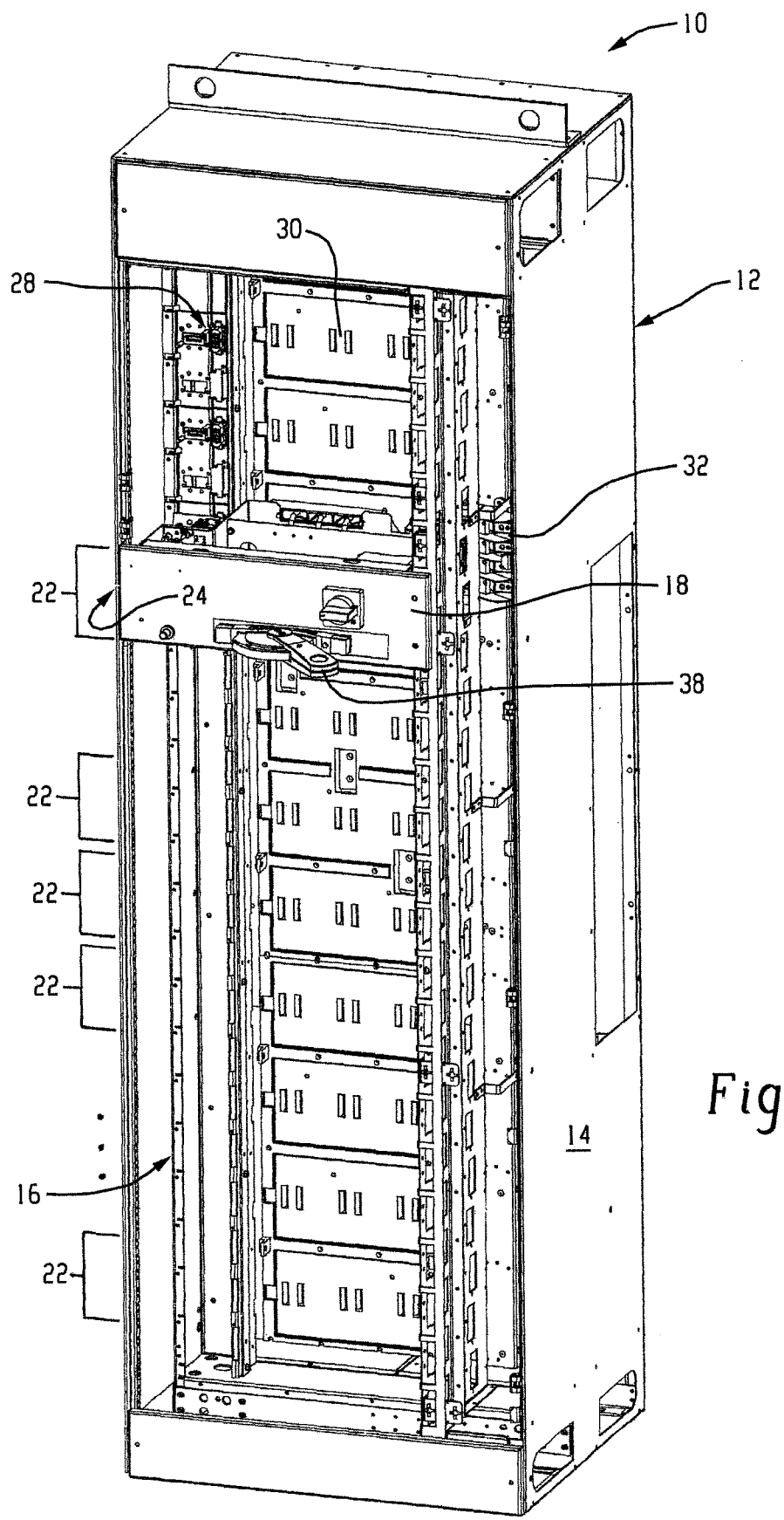
FIG. 1 is a perspective view of an exemplary electrical enclosure in accordance with the disclosure.
Figure 2:
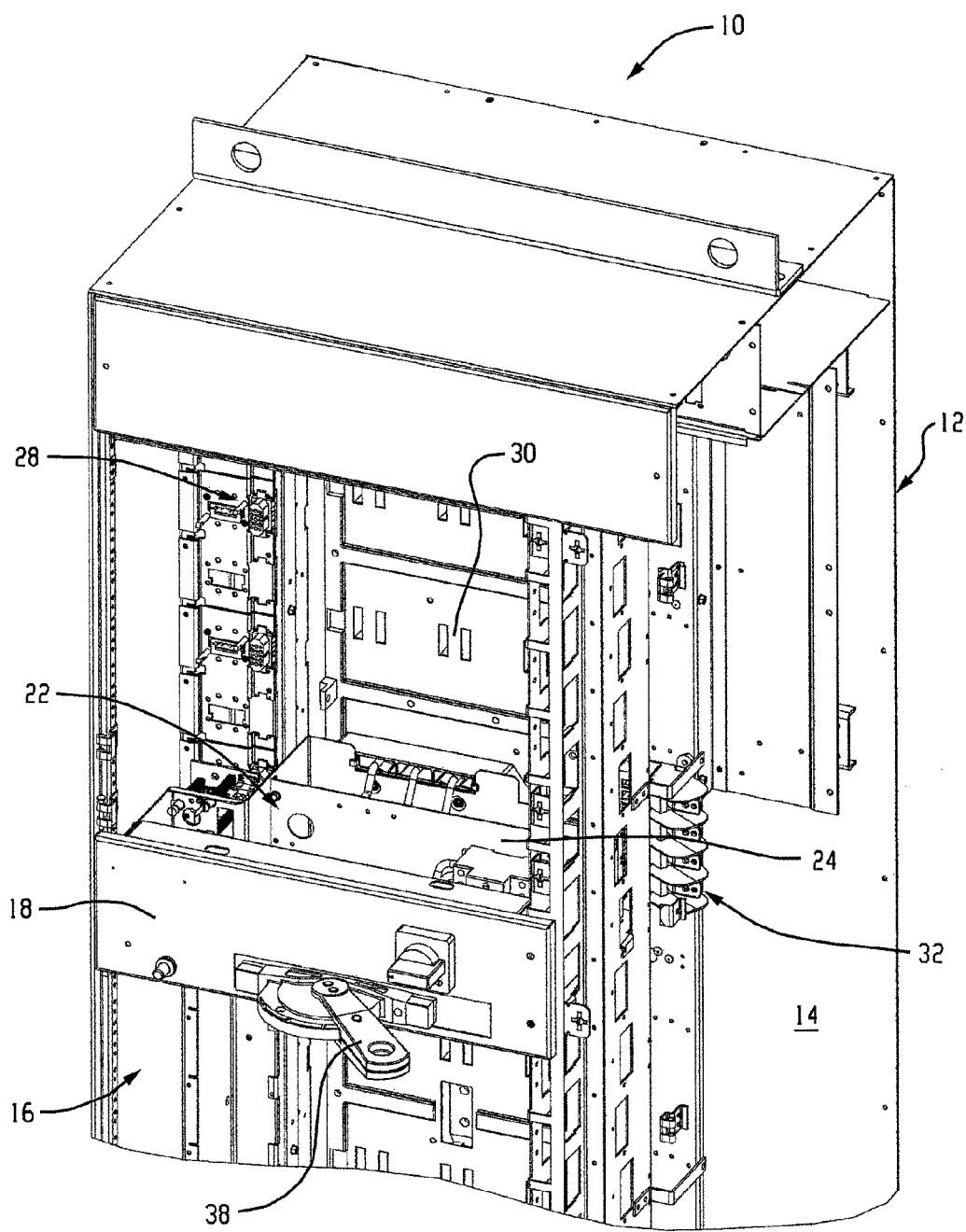
FIG. 2 is an enlarged view of the exemplary electrical enclosure of view illustrating the enclosure door in a closed position.

In FIGS. 1 and 2, an electrical enclosure cabinet in the form of a motor control cabinet (MCC) 10 is illustrated including an exemplary component support in accordance with the invention. The MCC 10 includes an enclosure 12 that houses various electrical components. The enclosure 12 will typically be formed of heavy gauge sheet metal, although other enclosures, such as made of reinforced plastic may sometimes be used. The enclosure generally includes a top, a bottom, and sidewalls forming a shell 14 having a main interior volume 16 in which components and component supports are placed. The interior volume 16 may be subdivided into compartments that each receive particular components, typically components interconnected to form a portion of an overall process control or monitoring system. Each compartment may be accessed through a main door 18, which may be secured in place with suitable fasteners such as screws or the like to hold the door 18 closed over the interior volume during normal operation.

Within each of the compartments, designated generally by reference numeral 22 in FIG. 2, component supports 24 may be disposed. As will be appreciated by those skilled in the art, the component supports 24 may be configured in various standard sizes or heights, and will typically comprise a metal drawer, sometimes referred to as a bucket, that can be slid into a compartment designed to accommodate the particular component support. On or within the component supports 24, a variety of components can be supported and interconnected. Such components are not shown in the figures such that the details of the component supports 24 can be seen.

As noted above, such components may include electronic devices, such as programmable logic controllers, power electronic devices, such as motor controllers, inverter drives, and so forth, as well as switchgear, input/output interfaces, protective circuit components, and so forth. The components are generally designed to perform some control or monitoring function within an overall machine system. Accordingly, data signals are exchanged with the components and remote control and monitoring equipment or computers (not shown). Power signals are also provided to the components, as described in greater detail below, for enabling energization of such components such as relays, contactors, and so forth. Similarly, three phase power is typically provided to those components which will provide power to driven loads. Such loads may include motors, actuators, valves, and any other electrical load that may be present in the controlled or monitored process.

Within each component support 24, a component connector assembly 28 is supported. In the illustrated embodiment, the component connector assembly 28 is disposed on a rear wall of the support. As will be appreciated by those skilled in the art, such component connector assemblies may be provided on any suitable surface or support of the component support, such as a side panel, a lower or upper corner, and so forth. The component connector assembly 28 is configured to mate with a prewired connector assembly within the enclosure to provide network signals and control power to the components within the component support 24. An exemplary component connector assembly 28 is set forth in commonly-assigned U.S. Pat. No. 7,419,394, which is hereby incorporated herein by reference in its entirety.

Each compartment also further includes vertical bus bars 30, also referred to as MCC line stabs, for supplying power to corresponding component support line stabs 31 of the component support 24. Load bus bars 32, also referred to as MCC load stabs, are configured to receive mating component support load stabs 33 of the component support 24 for connecting the electrical component to a load, such as a motor.

Each component support 24 has a support pan that is mountable to the enclosure within the compartment 22, and a bucket 36 (moveable support member) moveably supported on the support pan and adapted to receive an electrical component. The door 18 encloses the electrical component and component support 24 within the enclosure 12. An actuating mechanism 37, including a handle 38 accessible from an exterior of the enclosure 12, is provided to move the bucket 36 between at least two positions. For example, and as will now be described in detail, the bucket 36 can be moveable between an inserted position wherein the line and load stabs 31 and 33 are connected to the line and load bus bars 30 and 32, respectively, and a withdrawn position whereat the line stabs 31 and 33 are disengaged. An intermediate test position can be provided for connecting the controller interface for testing and/or diagnostics prior to engagement of the load stabs 31 and 33 with their respective busses. Movement of the bucket 36 between the positions is achieved through movement of the handle 38 with the door 18 closed.

Figure 3:
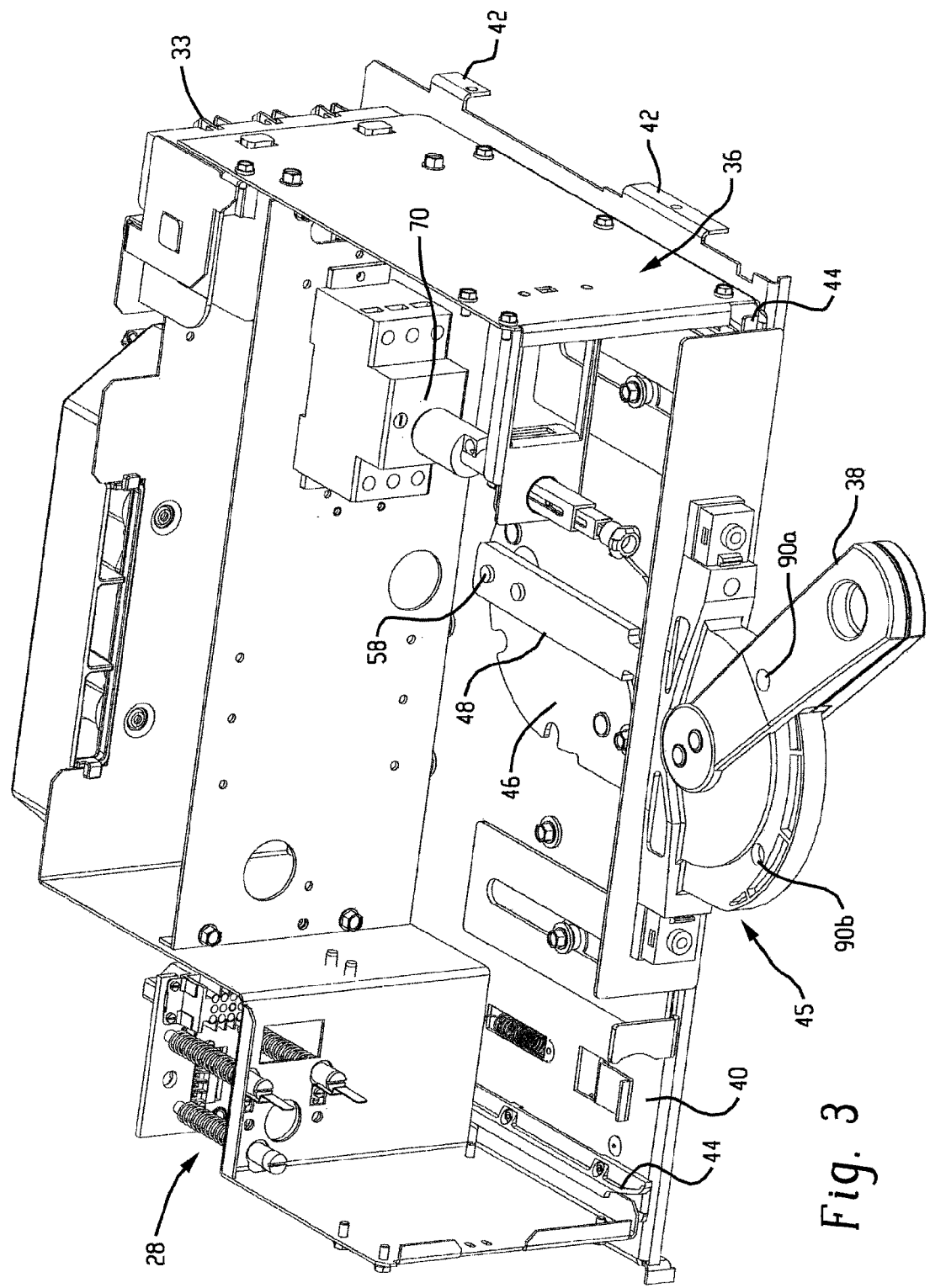
FIG. 3 is a perspective view of an exemplary support assembly with portions thereof removed to expose an exemplary actuation mechanism.
Figure 4:
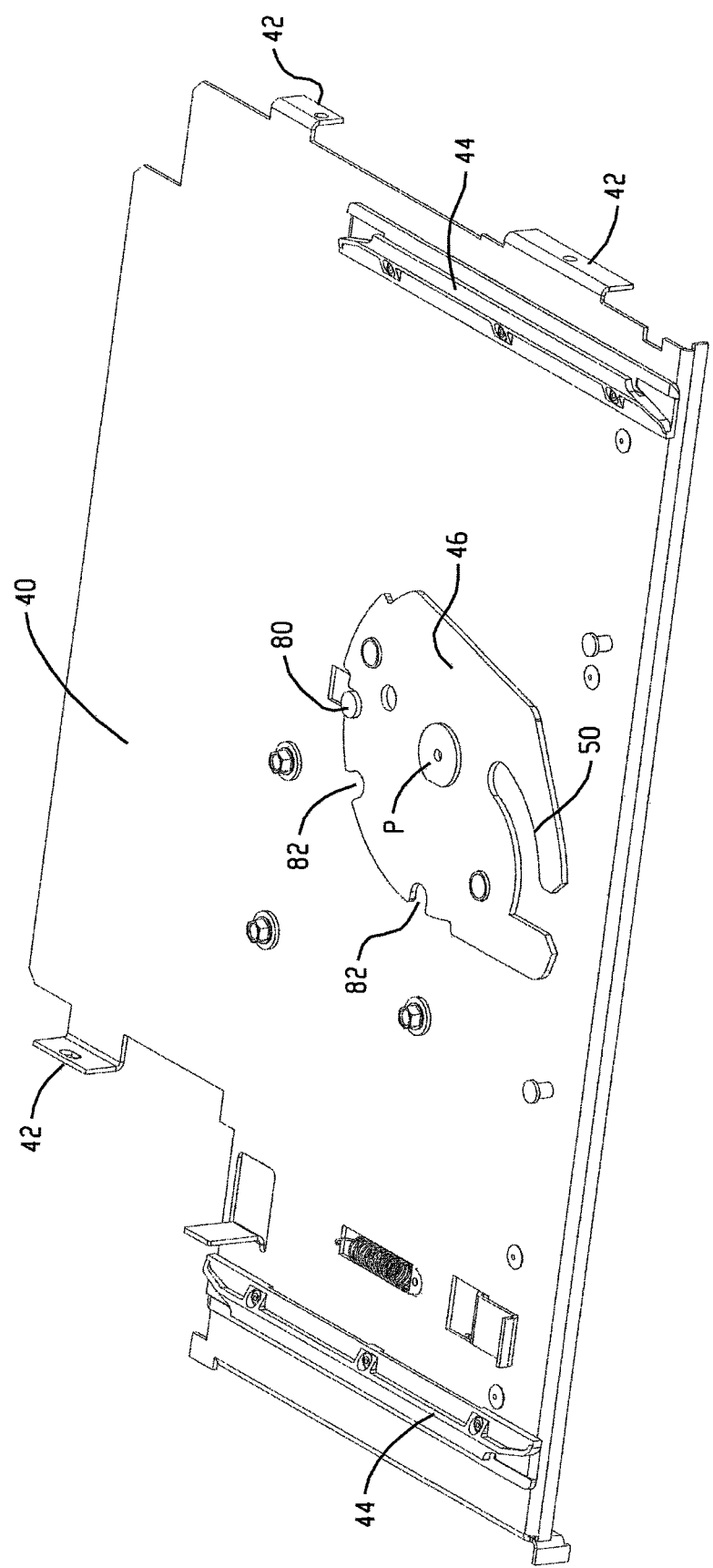
FIG. 4 is a perspective view of a support pan of the exemplary support assembly.

Referring now to FIGS. 3 and 4, an exemplary component support 24 in accordance with the invention is shown in detail, with portions thereof removed (e.g., the bottom of the bucket) in order to illustrate certain details of the support 24. The support structure 24 includes a support pan 40 mountable to the enclosure via mounting tabs 42. The support pan 40 includes a pair of laterally spaced-apart rails 44 which receive edges of the metal drawer or bucket 36 and support the same for sliding movement fore and aft within the enclosure 12 in response to movement of the handle 38.

The actuating mechanism 45 generally includes a gear 46, also referred to herein as a cam, mounted for rotation to the support pan 40 at pivot point P, and a linkage bar 48 attached between the gear 46 and the handle 38 such that movement of the handle 38 results in rotation of the gear 46 about pivot point P. A bushing 60 (not shown in FIG. 3 or 4) on the bottom of the bucket 36 engages gear slot 50 in the gear 46 to move the bucket 36 forward and back between various positions, as will be described in connection with FIGS. 5-10 below. The bottom of the bucket 36 has been removed from FIG. 3 to show the actuating mechanism 45.

Movement of the handle 38 from the right to the left in FIG. 3 tends to rotate the gear 46 clockwise about pivot point P. With reference to FIG. 4, as the gear 46 rotates clockwise, gear slot 50 tends to move towards the top of the page. The bushing 60 associated with the bucket 36, being engaged with the gear slot 50, is thus urged in the same direction. This results in movement of the bucket 36 between various positions, as will now be described.

Figure 5:
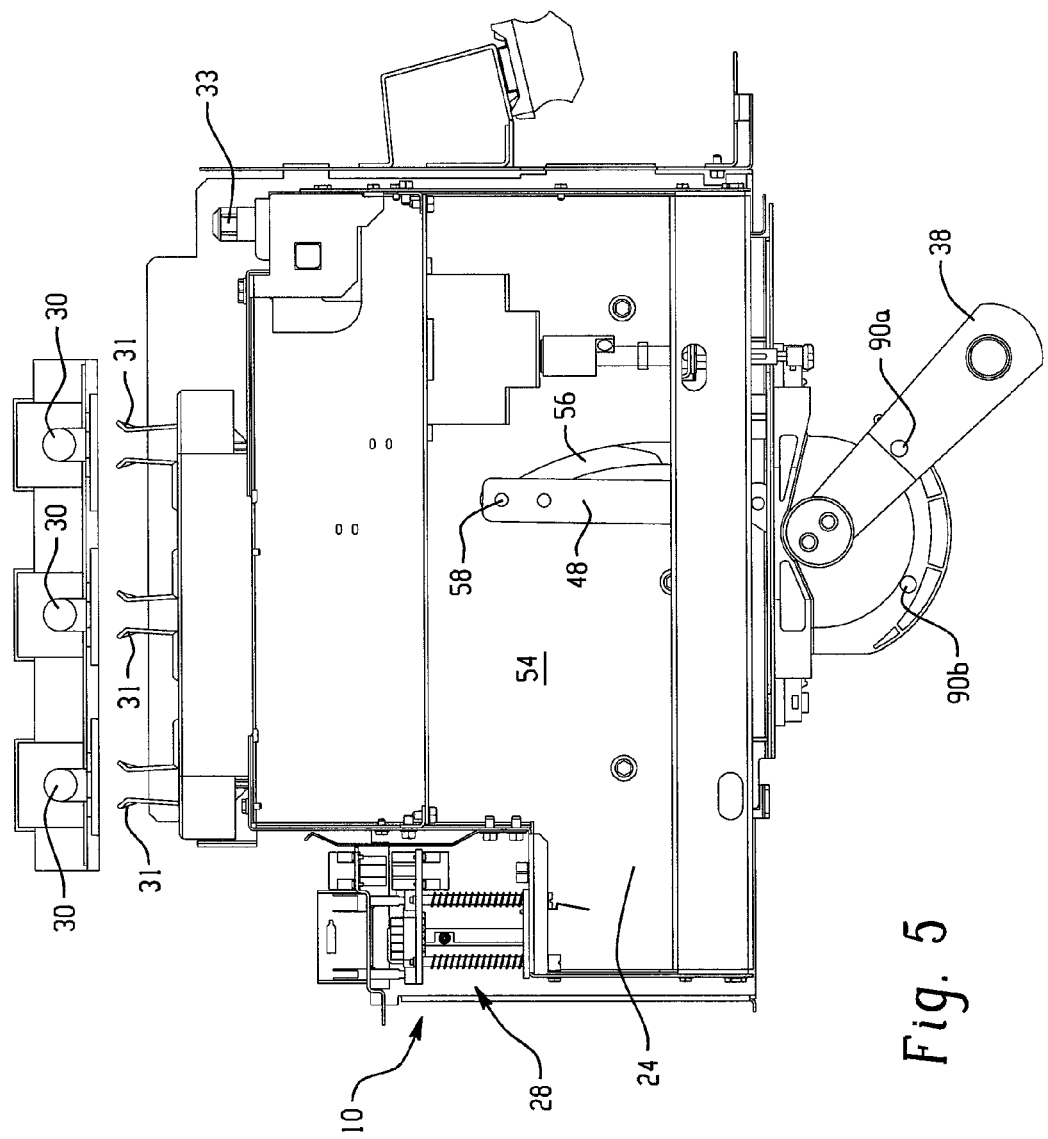
FIGS. 5 and 6 are top views of the support assembly in a withdrawn position.

In FIG. 5, the bucket 36 is shown in a withdrawn position whereat the bucket 36 and an associated electrical component is completely disconnected. In the withdrawn position of the illustrated embodiment, the handle 38 is to the right, and the bucket 36 is in a position closest to the front of the MCC unit. No line or load stabs are engaged, nor is the component connector assembly 28 connected. As will be appreciated, in the withdrawn position an associated electrical component is completely disconnected from power and/or communication thus permitting removal and/or replacement of the electrical component from the MCC unit.

In FIG. 5, the bottom surface 54 of the bucket 36 is illustrated thus obscuring the actuating mechanism 45 (except for handle 38) from view. As will be appreciated, bottom surface 54 includes a curved slot 56 through which the linkage bar 48 is connected to the gear 46 via a pin 58. The curved slot 56 is shaped to allow the pin 58 to move freely as the gear is rotated between the various positions.

Figure 6:
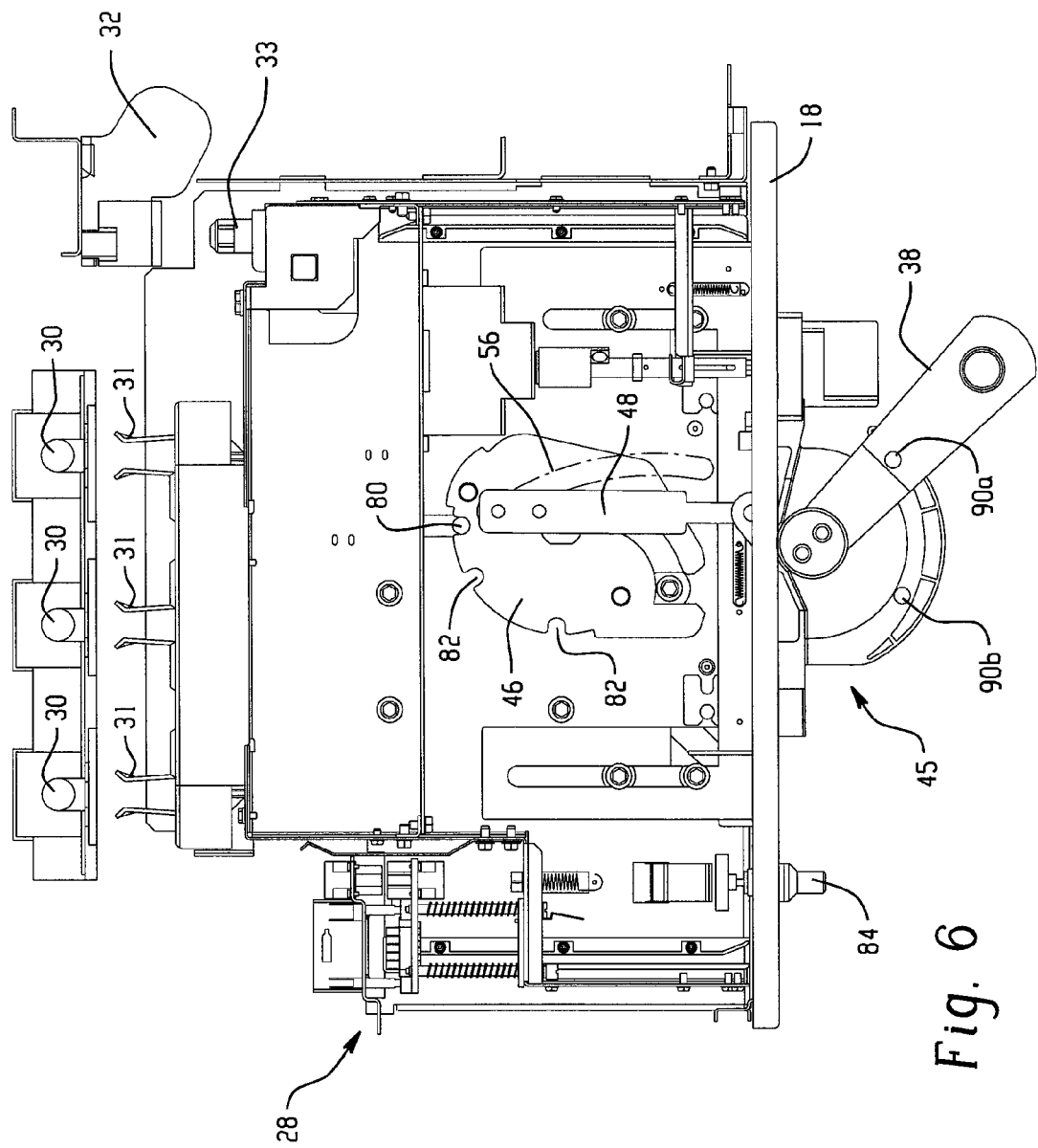

Turning to FIG. 6, the bottom surface 54 has once again been removed to allow the entire actuating mechanism 45 to be shown, with the curved slot 56 in the bottom surface 54 being shown in phantom. In this figure, the bushing 60 associated with the bottom surface 54 of the bucket 36 is shown engaged with gear slot 60. As will be appreciated, the gear slot 50 has a shape and size that allows the bushing 60 to slide therein as the gear 46 is rotated. The shape of the gear slot 50 can determine the relative movement of the bucket 36 in response to corresponding movement of the, handle 38. That is, the gear slot 50 can be configured to generate bucket movement in a linear or non-linear fashion in response to movement of the handle 38.

Figure 7:
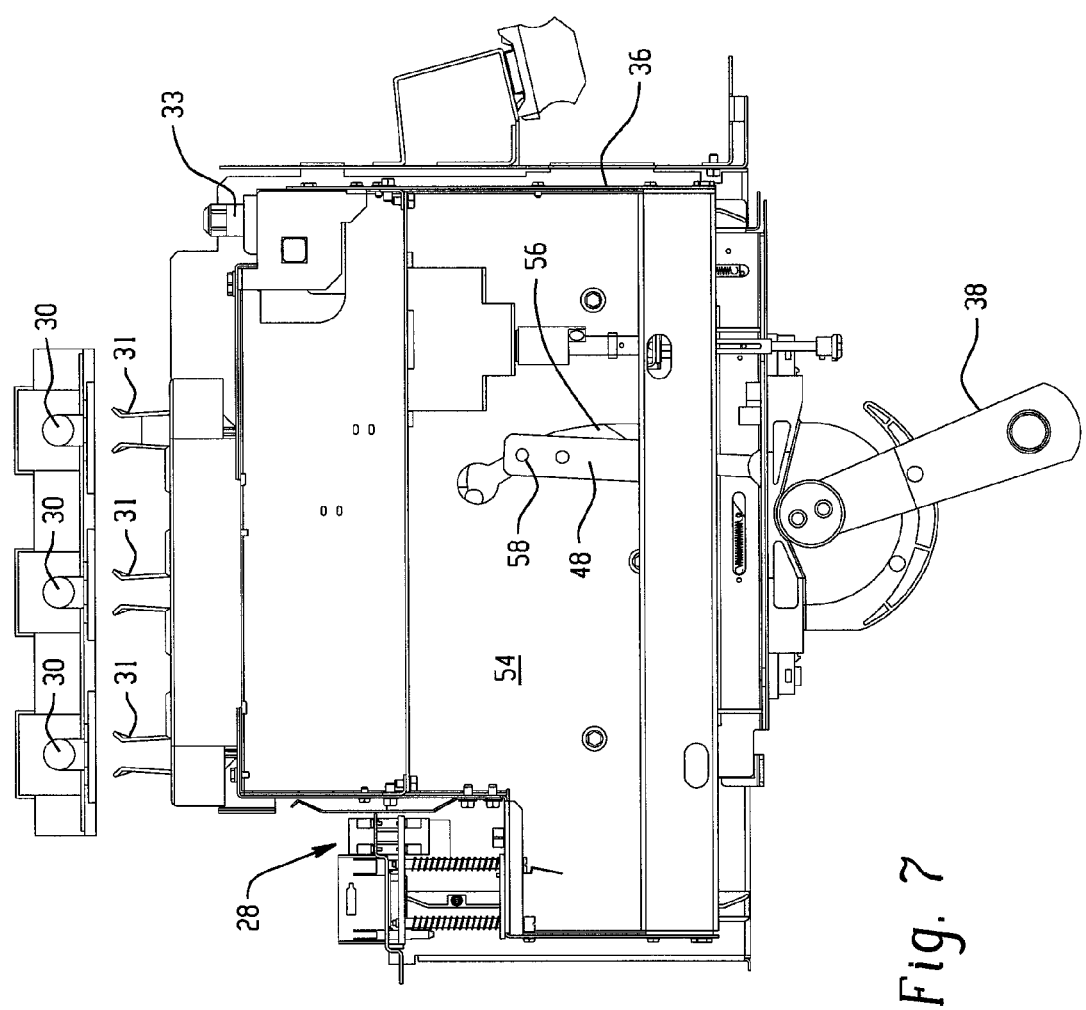
FIGS. 7 and 8 are top views of the support assembly in a test position.

In FIG. 7, the handle 38 has been moved part-way to the left to the test position. In the test position, the bucket 36 is shifted aft in the MCC unit such that the component connector assembly 28 is engaged. The line and load stabs 31 and 33 of the bucket 36 are shifted closer to the bus bars 30 and 32, although still not connected thereto. In this position, a communication link with the associated electrical component is established such that testing and/or diagnostics can be performed, but no power is provided to or from the associated electrical component.

Figure 8:
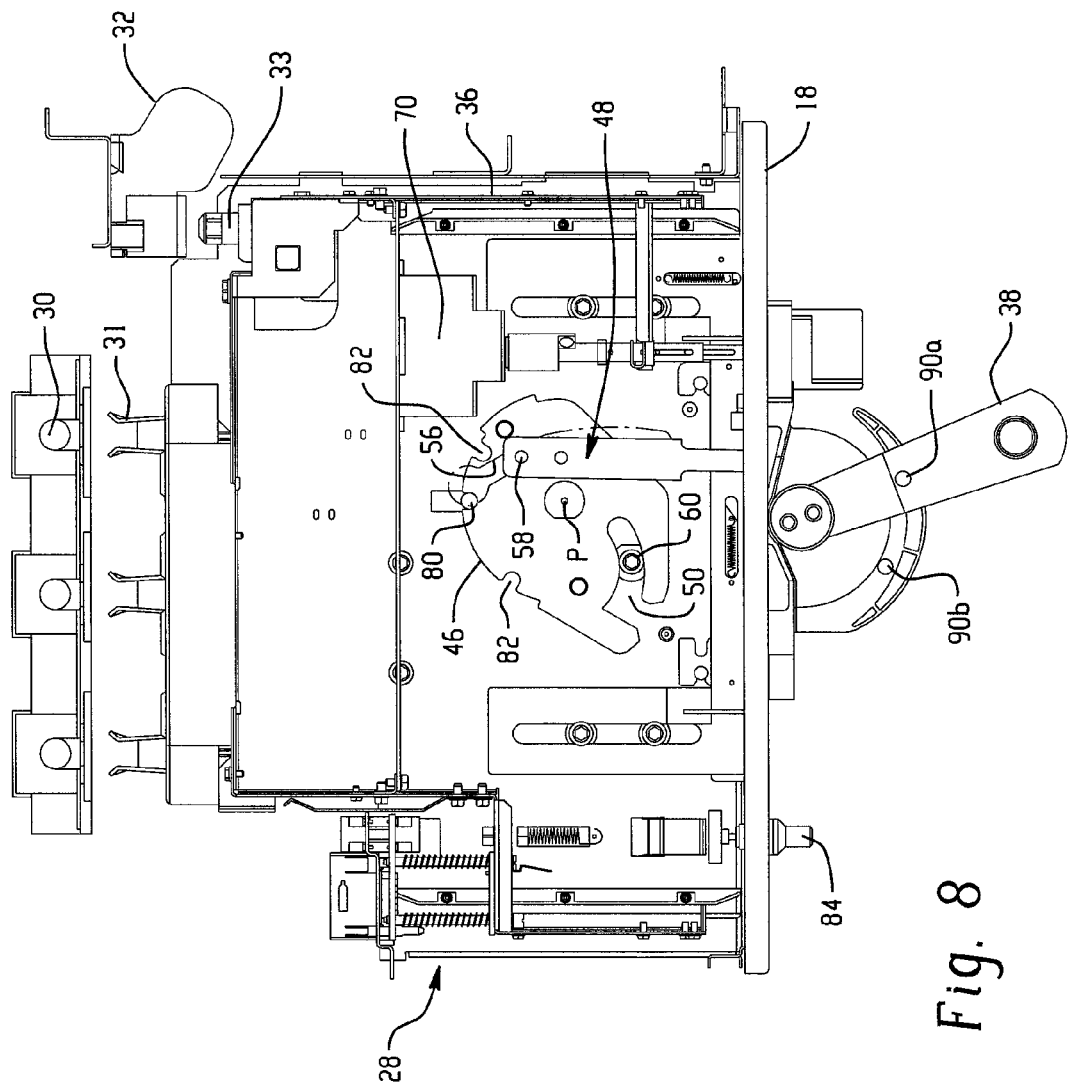

In FIG. 8, the bottom surface 54 of the bucket 36 has been removed so that the position of the gear 46 can be shown. As will be appreciated, movement of the handle 38 to the left has rotated the gear clockwise about pivot point P. The bushing 60 on the bottom surface 54 of the bucket 36, being engaged in the gear slot 50, has thus urged the bucket 36 aft within the MCC unit.

Figure 9:
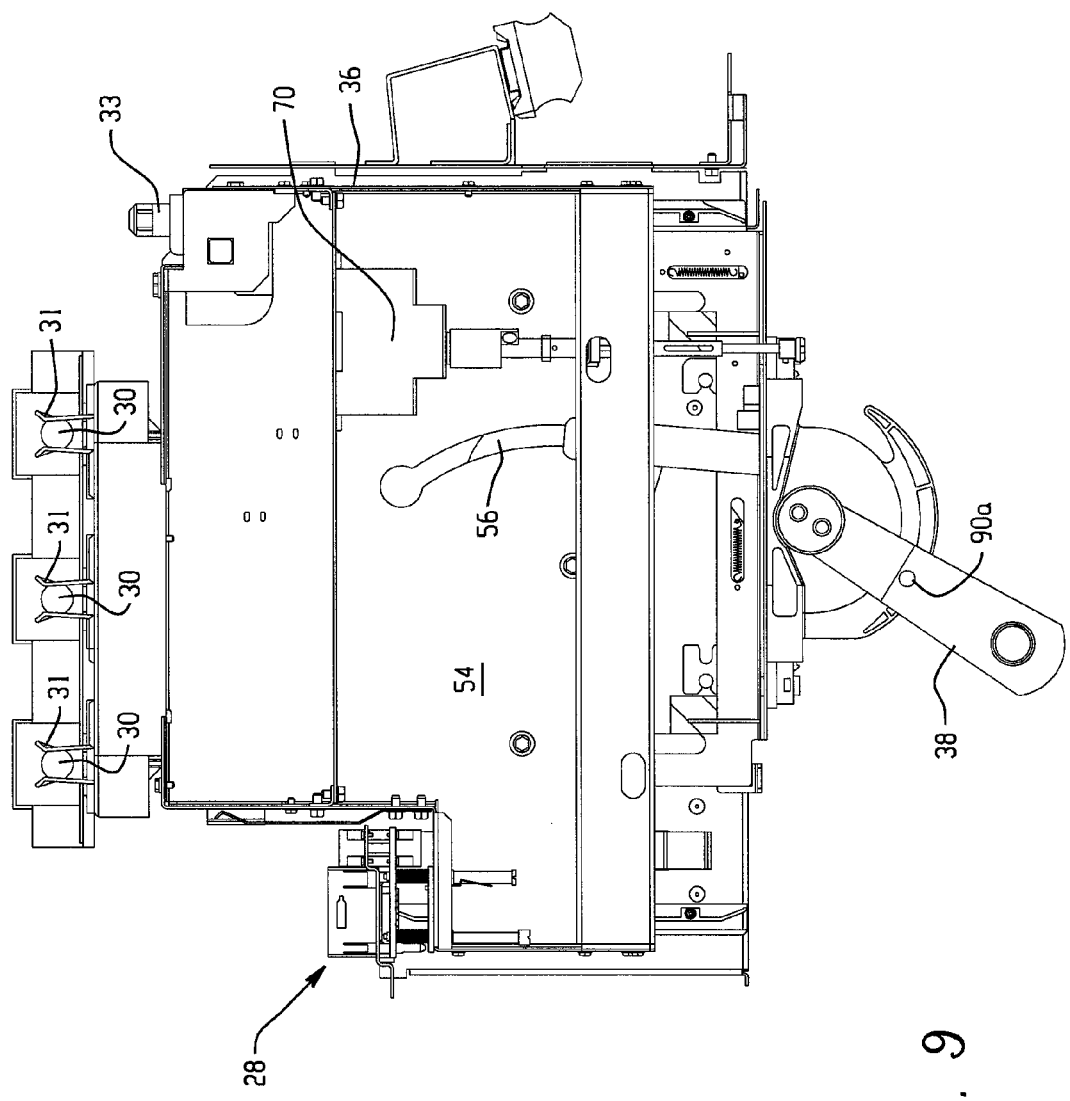
FIGS. 9 and 10 are top views of the support assembly in an inserted position.
Figure 10:
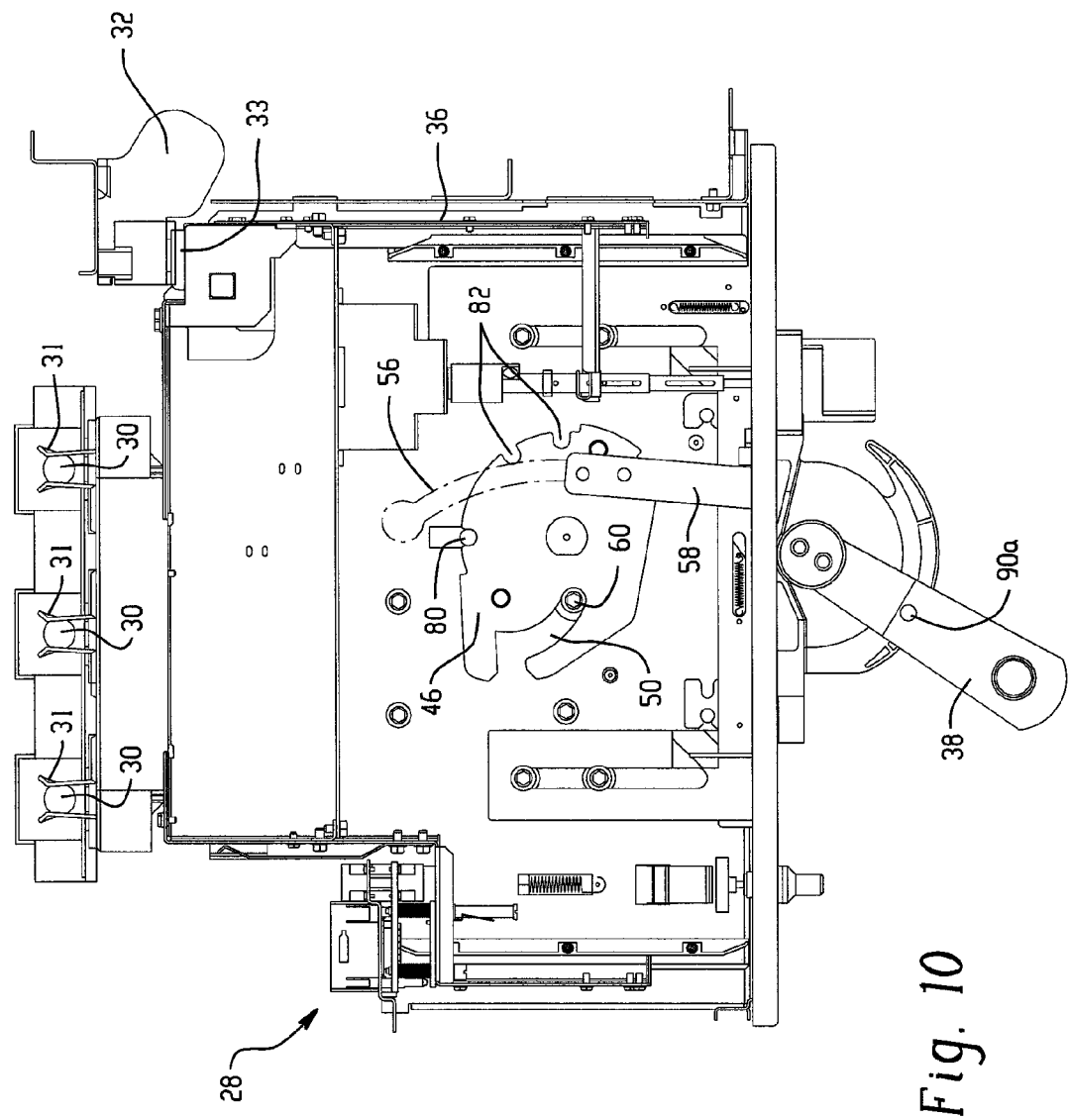

Turning to FIGS. 9 and 10, the component support 24 is shown in the fully inserted position. In this position, the line and load stabs 31 and 33 of the bucket 36 are engaged with the bus bars 30 and 32, respectively, and the component connector assembly 28 remains connected. This position corresponds to the typical operating position of the associated electrical device.

In FIG. 10, the bottom surface 54 of the bucket 36 has been removed to show the position of the gear 46 in the inserted position. As will be appreciated, movement of the handle 38 to the left has further rotated the gear 46 clockwise. Bushing 60 has reached the end of the gear slot 50 and, in doing so, has further urged the bucket 36 aft in the MCC unit to the position shown.

Having now described the details of an exemplary component support assembly and actuating mechanism, some further details of the MCC unit will now be described. Returning to FIG. 3, the component support assembly 24 further includes a rotary circuit breaker 70 for disconnecting power between an associated electrical component for removal thereof from the MCC unit, for example. Other types of circuit breakers, such as a linearly actuated circuit breaker, could also be provided.

With reference to FIGS. 3, 4, 6 and 8, and primarily FIG. 6, the component support 24 further includes a position interlock pin 80 (also referred to as a detent) configured to interlock with one or more notches 82 formed in a periphery of the gear 46. The position interlock pin 80 prevents or restricts rotation of the gear, and thus movement of the bucket 36, when engaged in a respective notch. For example, in FIG. 4 the position interlock pin restricts movement of the gear 46 from the withdrawn position as shown. Notches 82 are also provided in the gear 46 at positions corresponding to the test and inserted positions. The position interlock pin 80 is configured to be biased to the engaged position such that when a notch 82 is adjacent the pin 80, the pin 80 extends into the notch to thereby restrict movement of the bucket 36.

To release the position interlock pin 80 and permit rotation of the gear 46, a pushbutton 84 is provided on the door 18. The pushbutton 84 can be a mechanical or electrical switch that is configured to release the interlock pin 80 from engagement with a respective notch 82. To this end, a mechanical linkage can be provided between the pushbutton 84 and the interlock pin 80. Alternatively, release of the interlock pin can be effected via a solenoid or other electromechanical device, for example.

In operation, an electrical component or components first are installed within the bucket 36 in the withdrawn position, and the door 18 is positioned and secured in place as shown in FIGS. 1 and 2. When the component(s) are ready to be tested and/or activated, an operator proceeds to press the pushbutton 84 to release the position interlock pin 80. Once the interlock pin 80 is released, the operator then moves the handle 38 from the withdrawn position (e.g., FIG. 5) to the test position (e.g., FIG. 7) or the inserted position (e.g., FIG. 9) thereby making the one or more connections between the component(s) and the MCC unit.

To deactivate/disconnect the component(s), a similar process is employed. Specifically, the operator depresses the pushbutton 84 to release the position interlock pin 80, and then moves the handle 38 to the desired position.

As will now be appreciated, the support assembly 24 provides a platform for supporting and connecting/disconnecting electrical component(s) within a sealed MCC unit, without the need to open the MCC unit and without the use of special tools. The exemplary support assembly provides an integral handle for moving the electrical component(s) between inserted, withdrawn and test positions, for example. The integral handle 38 can provide lock-out/tag-out (LOTO) functionality since it can be positively locked in a given position by inserting a lock or tag member through corresponding lock holes 90a and 90b, for example.

As will further be appreciated, the component support 24 of FIGS. 1-10 facilitates connection and disconnection of the line and load stabs 31 and 33 through movement of the bucket 36. In past designs, the load stabs moved independent of the bucket in order to facilitate connection with respective busses, and wires are used to connect the load stabs to the electrical component(s). Such prior designs, while adequate for some applications, present the risk of wire pinching and/or fatigue due to flexing of the wires during connect and disconnect operations. By eliminating such wire movement, the present disclosure reduces the possibility for such problems.

Figure 11:
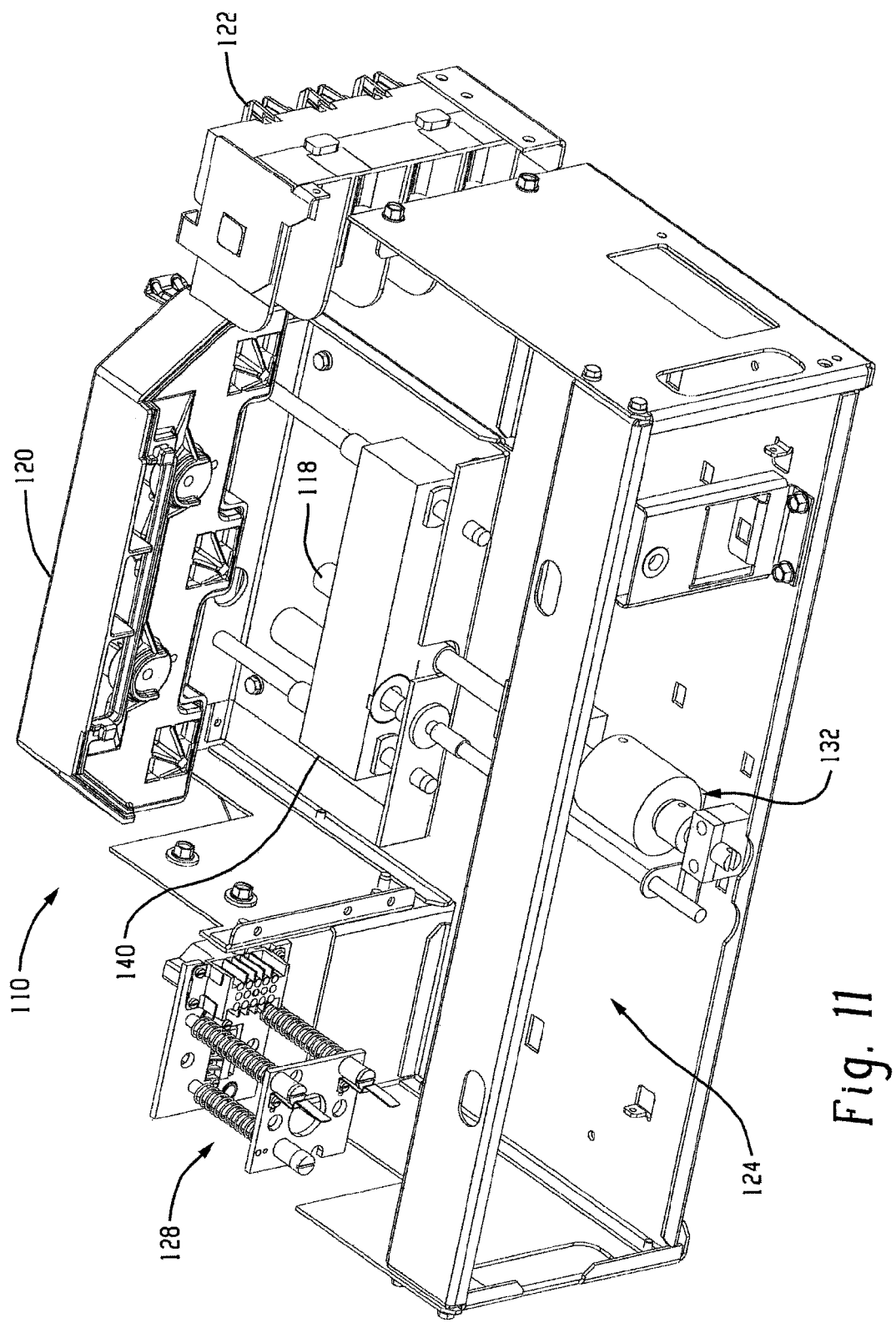
FIG. 11 is perspective views of another support assembly including a screw drive and a torque limiter.

FIG. 11 illustrates another exemplary electrical enclosure 110 (MCC unit) having a component support 114 that includes a screw-drive mechanism 118 for moving line and load stabs 120 and 122 between respective positions, such as connected and disconnected. The component support 114 includes many of the same structural features as the component support described in connection with FIGS. 1-10, including a bucket 124 for receiving an electrical component or components, and a component connector assembly 128 for connecting the component to a network or the like.

As noted, the component support 110 includes a screw-drive mechanism 118 for moving the line and load stabs 120 and 122 into and out of engagement. The screw-drive mechanism 118 includes a torque limiter 132 for limiting the amount of torque that is applied to the screw-drive to prevent damage to the screw-drive mechanism 118 from excessive application of force.

In contrast to the component support of FIGS. 1-10, the component support 114 has a fixed bucket 124. Thus, the line and load stabs 120 and 122 are configured to be moved by the screw-drive mechanism as opposed to the entire bucket. Movement of the line/load stabs is effected through rotation of a shaft (screw) 136. Although not shown, the shaft 136 is threadedly engaged with a nut within a screw drive block 140 such that rotation of the shaft 136 in a first direction displaces the line/load stabs in a first direction, and rotation of the shaft 136 in a second direction displaces the line/load stabs in a second direction.

The invention claimed is:

1. An electrical enclosure comprising:
   a shell having an enclosed interior volume for housing at least one associated electrical component;
   at least one movable support member mountable in the shell for supporting the at least one associated electrical component, the movable support member movable between a disengaged position corresponding to disconnection of the associated electrical component from line power, and an engaged position corresponding to connection of the associated electrical component to line power;
   a component connector assembly for connecting the associated electrical component with an associated control network, the component connector assembly configured to connect the associated electrical component to the associated control network when the movable support member is in the engaged position, disconnect the associated electrical component from the associated control network when the movable support member is in the disengaged position, and maintain the associated electrical component in connection with the associated control network during at least a portion of the movement of the movable support member between the engaged and disengaged positions after disconnection of the associated electrical component from line power;
   at least one actuator mechanism extending from the shell for effecting movement of the movable support member between the disengaged and engaged positions from an exterior of the enclosed interior volume;

wherein the actuator mechanism further comprises a cam pivotally mounted to a support pan of the shell, the cam including a curved gear slot in which a protrusion of the movable support member is received, and a linkage connecting the cam to a handle protruding from the shell, whereby actuation of the handle rotates the cam causing the protrusion to slide within the slot thereby displacing the moveable support member relative to the support pan between the engaged and disengaged positions.

2. The electrical enclosure as set forth in claim 1, further comprising a selectively releasable interlock mechanism for restricting movement of the moveable support member, the interlock mechanism being moveable between an interlocked position restricting movement of the moveable support member, and a released position permitting movement of the moveable support member.

3. The electrical enclosure as set forth in claim 1, further comprising at least one line or load stab supported on the moveable support member for movement therewith, the at least one line or load stab configured to selectively engage a bus bar when the moveable support member is moved to the engaged position.

4. The electrical enclosure as set forth in claim 1, further comprising at least one notch in a peripheral surface of the cam adapted to receive a moveable pin to selectively restrict rotation of the cam.

5. The electrical enclosure as set forth in claim 1, wherein the actuator mechanism includes at least one detent for restricting movement of the movable support structure from its engaged or disengaged position.

6. The electrical enclosure as set forth in claim 1, wherein the cam is mounted for rotation about a pivot point fixed to the support pan, and the linkage is connected to the cam via a pin extending through a slot in a bottom surface of the movable support member, the linkage connected to the cam at a position spaced apart from the pivot point.

7. The electrical enclosure as set forth in claim 6, wherein the curved gear slot in the cam opens to a peripheral edge thereof, and wherein a the protrusion further comprises a bushing on the movable support member adapted for sliding engagement in the gear slot for moving the movable support member between the engaged and disengaged positions.

8. The electrical enclosure as set forth in claim 7, wherein the gear slot has an arcuate profile having at least two radii.

9. The electrical enclosure as set forth in claim 1, wherein the interior volume is fully enclosed during movement of the moveable support member between the engaged and disengaged positions.

10. The electrical enclosure as set forth in claim 1, wherein further comprising at least one electrical component supported by the movable support member.

11. The electrical enclosure as set forth in claim 10, wherein the at least one electrical component includes at least one of a programmable logic controller, a motor controller, an inverter drive, an input/output interface, or a protective circuit component.

12. The electrical enclosure as set forth in claim 1, further comprising a plurality of movable support members, each movable support member configured to support an associated electrical component and being independently movable between engaged and disengaged positions.

13. An electrical power control system comprising:
an enclosure for housing an electrical power component, the enclosure including a main power bus;
a prewired connector assembly disposed in the enclosure and configured to receive data signals from a network and control power from a power source; and
a component support disposed in the enclosure, the component support having stabs supported thereon matable with the main power bus to provide a main power to one or more components supported by the component support, and a component connector assembly supported thereon matable with the prewired connector assembly to provide the data signals and control power to components supported by the support;
wherein the component support is movable between a disengaged position corresponding to disconnection of the component support from the main power bus, and an engaged position corresponding to connection of the component support to the main power bus; and
wherein the connector assembly is configured to connect with the prewired connector assembly when the component support is in the engaged position, disconnect from the prewired connector assembly when the component support is in the disengaged position, and maintain connection with the prewired connector assembly during at least a portion of the movement of the component support between the engaged and disengaged positions after disconnection of the component support from the main power bus; and
further comprising an actuator mechanism including a cam pivotally mounted to the enclosure, the cam including a curved gear slot in which a protrusion of the component support received, and a linkage connecting the cam to a handle protruding from the enclosure, whereby actuation of the handle rotates the cam causing the protrusion to slide within the slot thereby displacing the component support relative to the enclosure between the engaged and disengaged positions.

14. A method of connecting/disconnecting an electrical component supported in an electrical enclosure from one or more lines comprising:
supporting the electrical component on a movable support member mounted within the electrical enclosure, the movable support member having at least one load or line stab associated therewith for connecting the electrical component to a bus bar the movable support member movable between a disengaged position corresponding to disconnection of the electrical component from line power, and an engaged position corresponding to connection of the associated electrical component to line power;
providing a component connector assembly for connecting the electrical component with an associated control network, the component connector assembly configured to connect the electrical component to the associated control network when the movable support member is in the engaged position, disconnect the electrical component from the associated control network when the movable support member is in the disengaged position, and maintain the electrical component in connection with the associated control network during at least a portion of the movement of the movable support member between the engaged and disengaged positions after disconnection of the associated electrical component from line power;
activating an actuator mechanism configured to move the moveable support member between first and second positions, the actuator mechanism extending from a shell of the enclosure for effecting movement of the movable support member between the disengaged and engaged positions from the exterior of the enclosed shell and including a cam pivotally mounted to a support pan of the enclosure, the cam including a curved gear slot in which a protrusion of the movable support member is received, and a linkage connecting the cam to a handle protruding from the enclosure, whereby actuation of the handle rotates the cam causing the protrusion to slide within the slot thereby displacing the movable support member relative to the enclosure between the engaged and disengaged positions.

15. A method as set forth in claim 14, further comprising releasing an interlock mechanism prior to activating the actuating mechanism.

16. A method as set forth in claim 14, wherein the activating step includes manually moving a handle of the actuator mechanism, the handle extending from an interior of the electrical enclosure to an exterior of the electrical enclosure.

\* \* \* \* \*